United States Patent
Miyake et al.

[11] Patent Number: 6,165,376
[45] Date of Patent: Dec. 26, 2000

[54] WORK SURFACE TREATMENT METHOD AND WORK SURFACE TREATMENT APPARATUS

[75] Inventors: Koji Miyake; Takahiro Nakahigashi; Hajime Kuwahara, all of Kyoto, Japan

[73] Assignee: Nissin Electric Co., Ltd., Kyoto, Japan

[21] Appl. No.: 09/003,035

[22] Filed: Jan. 5, 1998

[30] Foreign Application Priority Data

Jan. 16, 1997 [JP] Japan ................................. 9-005468

[51] Int. Cl.$^7$ ............................ H01L 21/00; H05H 1/00
[52] U.S. Cl. .................... 216/67; 216/71; 438/729
[58] Field of Search ......................... 216/67, 71; 438/729; 156/345

[56] References Cited

U.S. PATENT DOCUMENTS

| | | |
|---|---|---|
| 4,464,223 | 8/1984 | Gorin . |
| 4,764,394 | 8/1988 | Conrad . |
| 4,950,377 | 8/1990 | Huebner . |
| 5,212,425 | 5/1993 | Goebel et al. . |
| 5,698,062 | 12/1997 | Sakamoto et al. ........................ 156/345 |
| 5,928,528 | 7/1999 | Kubota et al. ............................. 216/67 |
| 5,997,687 | 12/1999 | Koshimizu et al. ..................... 156/345 |

FOREIGN PATENT DOCUMENTS

| | | |
|---|---|---|
| 653 501 A1 | 5/1995 | European Pat. Off. . |
| 793 254 A2 | 9/1997 | European Pat. Off. . |
| 0 821 077 A2 | 1/1998 | European Pat. Off. . |
| 4-26436 | 9/1992 | Japan . |
| 4-280055 | 10/1992 | Japan . |
| 08-255782 | 10/1996 | Japan . |
| 2 240 114 | 7/1991 | United Kingdom . |

*Primary Examiner*—Thi Dang
*Attorney, Agent, or Firm*—Arent Fox Kintner Plotkin & Kahn PLLC

[57] ABSTRACT

A work is supported by a work support electrode arranged in a vacuum container, a treatment gas corresponding to intended treatment of the work is supplied into the container, and a vacuum is produced in the container. Plasma is formed from the gas by applying an amplitude-modulated high-frequency power to an electrode electrically insulated from the work support electrode, said amplitude-modulated high-frequency power being prepared by effecting amplitude modulation on a basic high-frequency power having a predetermined frequency in a range from 10 MHz to 200 MHz with a modulation frequency in a range from $\frac{1}{1000}$ to $\frac{1}{10}$ of said predetermined frequency. A positive pulse voltage is applied to the work support electrode to effect the treatment on the surface of the work supported by the work support electrode.

10 Claims, 4 Drawing Sheets

WORK SURFACE TREATMENT METHOD AND WORK SURFACE TREATMENT APPARATUS

BACKGROUND OF THE INVENTION

1. Field of the Invention

The present invention relates to a method and an apparatus for effecting treatment on a surface of an object, i.e., a work and more particularly for effecting treatment such as film deposition, etching or quality modification by exposing a work to be treated to a plasma and implanting ions in the plasma into the work.

2. Description of the Background Art

PSII (Plasma Source Ion Implantation) has been known as a technology for surface treatment of an object, and an example of an apparatus for the same is shown in FIG. 6.

This apparatus has a grounded vacuum container 1. An exhaust device 11 and a treatment gas supply unit 3 are provided for the container 1. The treatment gas supply unit 3 includes a mass-flow controller, a gas source and others, which are not shown in the figure. An electrode 2 also serving as a holder for supporting a work S, i.e., an object to be treated is arranged in the container 1. The electrode 2 is connected to a DC high-voltage source 22 through an on-off switch 21. A filament 4 which is supplied with an electric power and thereby is heated for emitting electrons is arranged in the container 1. The filament 4 is connected to a filament power source 41 and a discharge bias power source 42.

For effecting surface treatment on the work S by this apparatus, the work S is transported into the vacuum container 1 by an unillustrated work transporting device, and is held by the holder 2. Then, a treatment gas such as nitrogen gas is supplied into the container 1 from the gas supply unit 3 while keeping a predetermined degree of vacuum in the container 1 at the order of $10^{-4}$ by operating the exhaust device 11. Also, the filament power source 41 energizes and thereby heats the filament 4 to emit electrons, and the discharge bias power source 42 applies a bias voltage to the filament 4 to accelerate the emitted electrons. Thereby, the treatment gas which is introduced as described above is ionized to form plasma P. During this, the electrode 2 is supplied with a negative high-voltage pulse from the power source 22 through the on-off switch 21. Thereby, the surface of the work S is exposed to the plasma P, and the positive ions in the plasma P are accelerated toward the work S and are implanted into the surface of the work S so that treatment such as modification of quality is effected on the surface of the work S.

According to the above apparatus and method for the surface treatment, predetermined treatment can be effected relatively uniformly on the surface of the work having a complicated three-dimensional structure.

However, the apparatus and method for the surface treatment in the prior art suffer from the following problems. For example, a work, such as an object used in semiconductor device, may have different kinds of portions, i.e., a portion which is covered with an electrically insulating material or is in a floated potential, and a portion which is made of an electrically conductive material, such as an electrically conductive circuit, and it may be desired to effect the treatment only on the above conductive portion. In the processing for this treatment, a pulse voltage is not applied to the insulated portion or the portion carrying the floated potential (both of which will be generally termed as the "insulated portion"), and the positive ions are not ideally implanted into the insulated portion. However, due to the weight of ions, the ions cannot rapidly change their course at the vicinity of the surface of the insulated portion during an on-period of the pulse voltage so that the ions collide with and are implanted into the surface of the insulated portion at and around its end. Generally, when ions are implanted into a work surface with a high energy from about several kilovolts to hundreds of kilovolts, a large amount of secondary ions are emitted from the work surface. If the work surface partially has an insulated portion, positive electric charges are rapidly accumulated at the surface of the insulated portion due to the positive ions, which are implanted into the other portion, i.e., the conductive portion and the end of the insulated portion, and emitted secondary electrons. As a result, an electric field formed by the positive charges causes irregularities in the ion implantation distribution at the conductive portion, and discharge occurs between the surface of the insulated portion and the surface of the conductive portion supplied with the negative high-voltage pulse so that the surface of these portions may be destroyed.

SUMMARY OF THE INVENTION

An object of the invention is to provide a method for surface treatment, in which predetermined surface treatment can be effected on a work portion made of an electrically conductive material without damaging the work even if the work has a surface portion made of an electrically insulating material or carrying a floated potential as well as an apparatus for implementing the method.

Another object of the invention is to provide a method for surface treatment, in which predetermined surface treatment can be effected uniformly on a work portion made of an electrically conductive material even if the work has a surface portion made of an electrically insulating material or carrying a floated potential as well as an apparatus for implementing the method.

The invention provides a work surface treatment method comprising the steps of supporting a work by a work support electrode arranged in a vacuum container; supplying a treatment gas corresponding to intended treatment of the work into said container; forming plasma from the gas by applying in a vacuum an amplitude-modulated high-frequency power to an electrode electrically insulated from said work support electrode, said amplitude-modulated high-frequency power being prepared by effecting amplitude modulation on a basic high-frequency power having a predetermined frequency in a range from 10 MHz to 200 MHz with a modulation frequency in a range from $\frac{1}{1000}$ to $\frac{1}{10}$ of said predetermined frequency; and applying a positive pulse voltage to said work support electrode to effect the treatment on the surface of said work supported by said work support electrode.

The invention also provides a work surface treatment apparatus comprising a vacuum container; a work support electrode arranged in said vacuum container; an electrode electrically insulated from said work support electrode; an exhaust device; a treatment gas supply device; a high-frequency power supply device for supplying an amplitude-modulated high-frequency power to the electrode electrically insulated from said work support electrode, said amplitude-modulated high-frequency power being prepared by effecting amplitude modulation on a basic high-frequency power having a predetermined frequency in a range from 10 MHz to 200 MHz with a modulation frequency in a range from $\frac{1}{1000}$ to $\frac{1}{10}$ of said predetermined frequency; and a pulse voltage application device for applying a positive pulse voltage to said work support electrode.

Said amplitude modulation may be pulse modulation performed by on/off of supply of the electric power, or may be modulation in a pulse form.

Variation with time occurs in density of the negative ions in the plasma while the plasma is being formed from the gas by supplying the pulse-modulated high-frequency power.

This variation will now be described below with reference to FIG. 1. According to the research and study by the inventors, negative ions present in the plasma, which remains after cut-off of the pulse-modulated high-frequency power, start to increase in quantity, although this depends on a magnitude and others of the pulse-modulated high-frequency power. In this illustrated example, the increase of the negative ions reaches a peak after about 40 μsec from cut-off of the pulse-modulated high-frequency power, and the negative ions will disappear within about 200 μsec after the cut-off of the power. Therefore, the negative ions in the remaining plasma can be implanted into the work surface in such a manner that the pulse-modulated high-frequency power is supplied to the treatment gas for forming the plasma from the treatment gas, and the positive voltage is applied to the electrode supporting the work during a period containing a period that a large amount of negative ions are present after the cut-off of the power. This is owing to the fact that the negative ions are accelerated toward the work support electrode by a potential difference between the work support electrode and the plasma formed by application of the positive voltage.

The work may partially have an insulated portion (a portion made of an electrically insulating material or a portion in a floated potential) at its surface. In this case, the negative ions are implanted into an end of the insulated portion. However, charges of the implanted negative ions and charges of the emitted secondary electrons cancel each other so that accumulation of the charges at the work surface can be suppressed to a practically allowable extent. Thereby, it is possible to suppress the irregular surface treatment which may be caused by accumulation of charges as well as damages on the object which may be caused by discharging at the vicinity of the work surface.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A work surface treatment method which will be described below comprises the steps of supporting a work by a work support electrode arranged in a vacuum container; supplying a treatment gas corresponding to intended treatment of the work into the container; forming plasma from the gas by applying in a vacuum an amplitude-modulated high-frequency power to an electrode electrically insulated from said work support electrode, said amplitude-modulated high-frequency power being prepared by effecting amplitude modulation on a basic high-frequency power having a predetermined frequency in a range from 10 MHz to 200 MHz with a modulation frequency in a range from $\frac{1}{1000}$ to $\frac{1}{10}$ of said predetermined frequency; and applying a positive pulse voltage to said work support electrode to effect the treatment on the surface of said work supported by said work support electrode.

A work surface treatment apparatus which will be described below comprises a vacuum container; a work support electrode arranged in the vacuum container; an electrode electrically insulated from the work support electrode; an exhaust device; a treatment gas supply device; a high-frequency power supply device for supplying an amplitude-modulated high-frequency power to the electrode electrically insulated from said work support electrode, said amplitude-modulated high-frequency power being prepared by effecting amplitude modulation on a basic high-frequency power having a predetermined frequency in a range from 10 MHz to 200 MHz with a modulation frequency in a range from $\frac{1}{1000}$ to $\frac{1}{10}$ of said predetermined frequency; and a pulse voltage application device for applying a positive pulse voltage to said work support electrode.

A preferred embodiment of the invention will now be described below with reference to the drawings.

Figure 1:
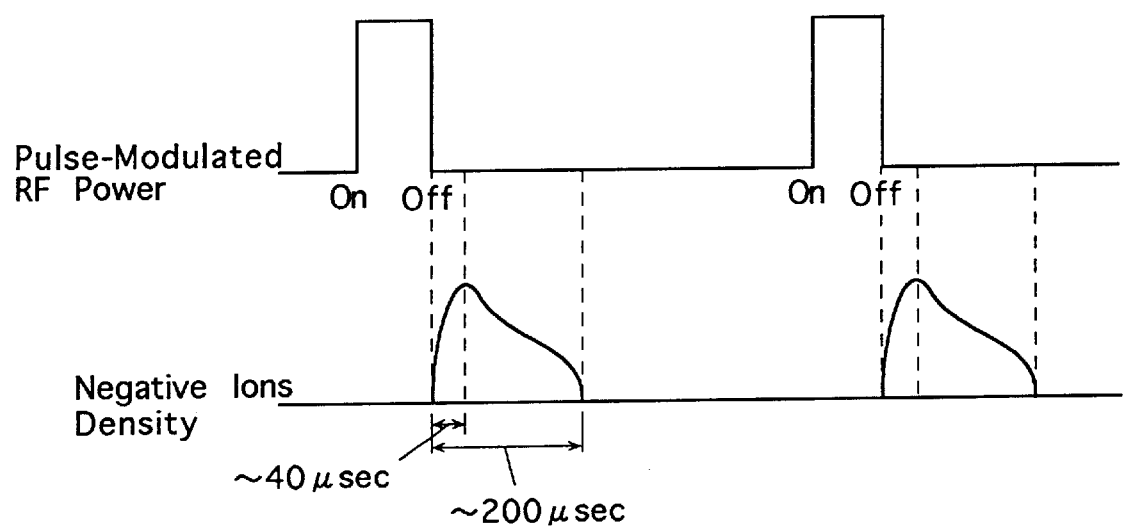
FIG. 1 shows a density of negative ions in plasma formed by supply of a pulse-modulated high-frequency power.
Figure 2:
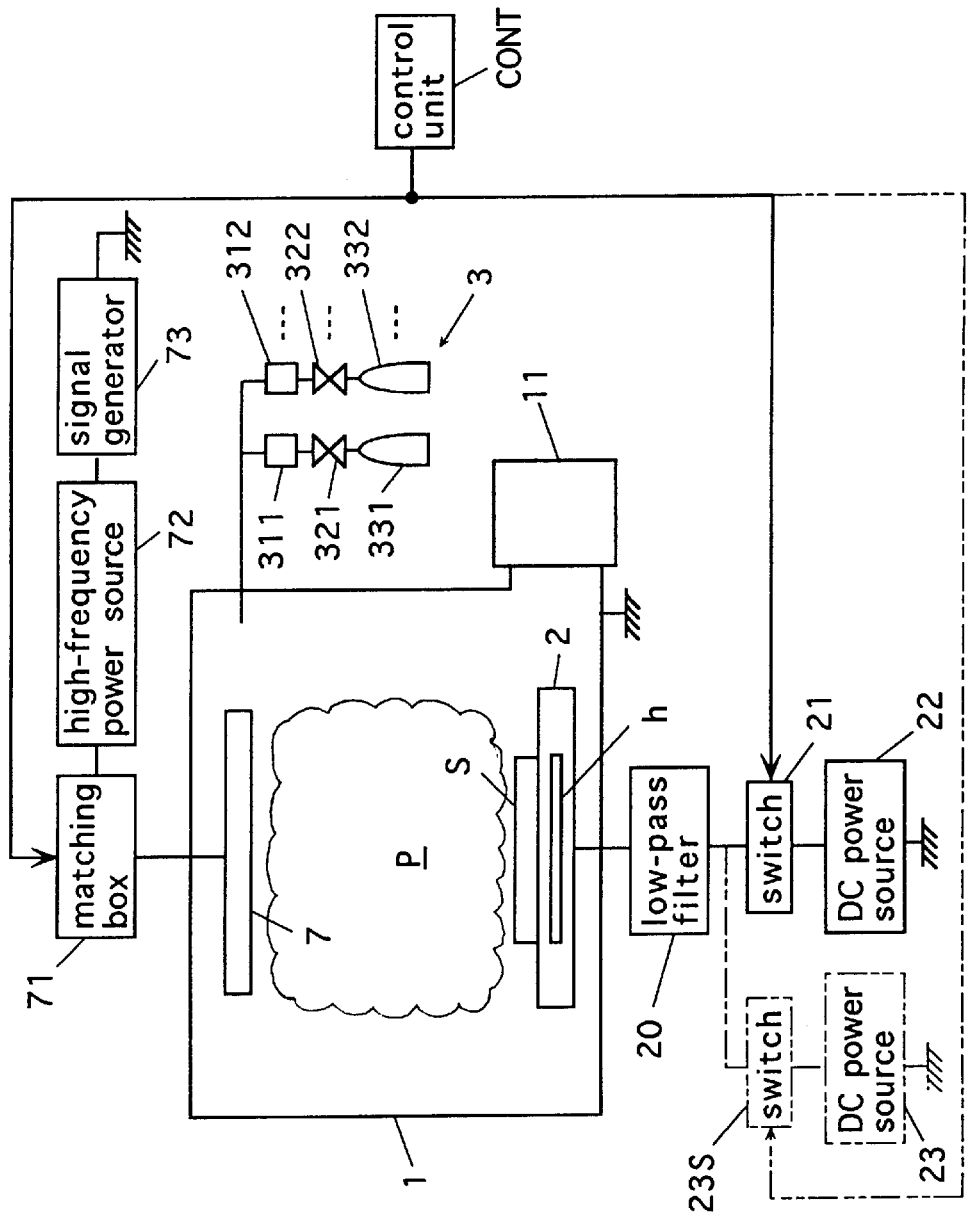
FIG. 2 schematically shows a structure of an example of a work surface treatment apparatus according to the invention.

FIG. 2 shows a schematic structure of an example of a work surface treatment apparatus according to the invention. This apparatus has a vacuum container 1 additionally provided with an exhaust device 11. Electrodes 2 and 7 opposed to each other are arranged in the container 1. The electrode 2 serves also as a work support holder, and is connected to a DC power source 22 through a low-pass filter 20 and an on-off switch 21. In FIG. 2, the power source 23 and on-off switch 23S will be described later more in detail. A heater h is provided at the electrode 2. The electrode 7 is a high-frequency electrode and is connected to a signal generator 73 which can generate an arbitrary waveform through a matching box 71 and a high-frequency power source 72. A control unit CONT is connected to the switch 21 and the high-frequency power source 72, and controls timing of supply of a pulse-modulated high-frequency power and application of a positive pulse voltage, which will be described later.

Further, a treatment gas supply unit 3 is provided for the container 1. The gas supply unit 3 includes one or more gas sources 331, 332, ... of treatment gases which are connected to the container 1 through mass-flow controllers 311, 312, ... and electromagnetic valves 321, 322, ..., respectively.

For effecting predetermined surface treatment on the work S by this apparatus, the work S is transported into the container 1 and is held by the holder 2. Then, the exhaust device 11 operates to attain and keep a predetermined degree of vacuum in the container 1. Also, a treatment gas is supplied into the container 1 from the gas supply unit 3, and the high-frequency power is supplied from the signal generator 73 to the electrode 7 through the high-frequency power source 72 and the matching box 71. The high-frequency power thus supplied is prepared by pulse modulation which is effected on a basic high-frequency power having a predetermined frequency in a range from 10 MHz to 200 MHz with a modulation frequency in a range from $1/1000$ to $1/10$ of the predetermined frequency of the basic high-frequency power. Also, a positive voltage of a predetermined magnitude is applied to the electrode 2 from the power source 22 through the on-off switch 21. The supply of the pulse-modulated high-frequency power to the electrode 7 and the application of the positive voltage to the electrode 2 are controlled to start and stop repetitively at constant periods.

The basic high-frequency power before modulation for producing the amplitude-modulated high-frequency power may have a sinusoidal waveform, a square waveform, a saw-tooth-like waveform, a triangular waveform or others.

By the following reason, the embodiment uses the basic high-frequency power having the frequency in the range from 10 MHz to 200 MHz. If it were lower than 10 MHz, it would be difficult to trap or confine efficiently the plasma. If it were larger than 200 MHz, it would be difficult for electrons to follow sufficiently the frequency, and it would be difficult to produce efficiently the plasma.

By the following reason, the embodiment employs the frequency for the amplitude modulation in the range from $1/1000$ to $1/10$ of the frequency of the basic high-frequency power. If it were smaller than $1/1000$, it would be difficult to obtain an effect by the modulation. If it were larger than $1/10$, the amplitude modulation would result in a state similar to a state achieved by double supply of the basic high-frequency power rather than a state achieved by effecting the amplitude modulation on the basic high-frequency power.

A duty ratio (on-time/on-time and off-time) of the pulse modulation of the high-frequency power can be in a range from about 0.1% to about 50%.

The timing at which the modulated high-frequency power is supplied to the electrode 7 and the positive pulse voltage is applied to the electrode 2 are determined as follows. The timing of rising of the positive pulse voltage applied to the electrode 2 (application start timing or on-timing) is determined between an intermediate time (e.g., a half point) in the on-period of supply of the pulse-modulated high-frequency power to the electrode 7 and a certain time in the subsequent off-period. The timing of falling of the positive pulse voltage applied to the electrode 2 (application stop timing or off-timing) is determined between a certain time in the off-period of supply of the pulse-modulated high-frequency power to the electrode 7 and an intermediate time (e.g., a half point) in the subsequent on-period. More preferably, it is determined between the time in the off-period of supply of the pulse-modulated high-frequency power supply to the electrode 7 and the end of this off-period.

Further, the period for which the positive pulse voltage is applied to the electrode 2 preferably includes a period during which negative ions are present after cut-off of the pulse-modulated high-frequency power to the electrode 7, and further preferably includes a portion or the whole of the period during which many negative ions are present. The foregoing timing in connection with application of the positive pulse voltage is an example of the timing determined within the period including at least a portion of the period during which many negative ions are present. In contrast to this example, it is not impossible to apply the positive pulse voltage during the whole period of the treatment. However, if the on-period of application of the positive pulse voltage is excessively larger, a power supply cost wastefully and therefore unpreferably increases.

From the foregoing, it can be understood that the application of the positive pulse voltage is preferably performed at least for a period starting before and ending after the point of time when the quantity of the negative ions reaches the peak during the off-period of the pulse-modulated high-frequency power.

Figure 3:
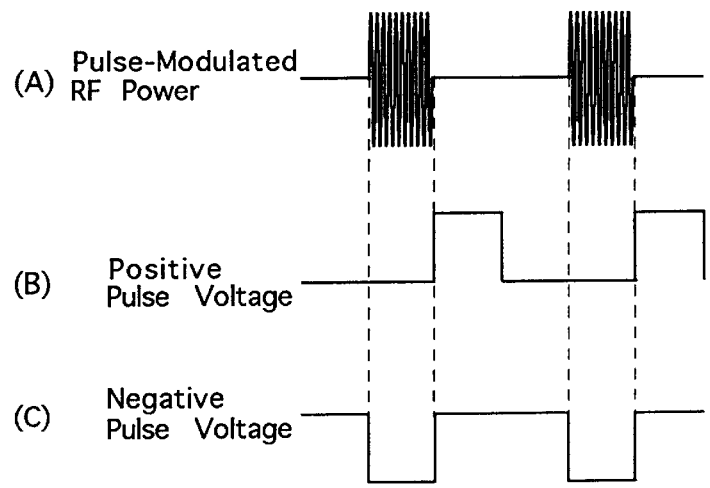
FIG. 3 shows at (A) an example of timing of supply of a pulse-modulated high-frequency power to an electrode 7 during work surface treatment by the apparatus shown in FIG. 2, shows at (B) an example of timing of application of a positive pulse voltage to an electrode 2, and shows at (C) an example of timing of application of a negative pulse to the electrode 2.

A specific example is as follows. As shown at (A) and (B) in FIG. 3, the supply of the high-frequency power to the electrode 7 stops at the same timing as the start of application of the positive voltage to the electrode 2, and the application of the positive voltage to the electrode 2 stops during the off-period of supply of the high-frequency power to the electrode 7.

Thereby, treatment depending on the kind of the treatment gas is effected on the surface of the work surface S.

According to the work surface treatment method and apparatus described above, the negative ions in the plasma increase in quantity after the stop of supply of the pulse-modulated high-frequency power to the electrode 7. However, the positive voltage is applied to the work support electrode 2 during the period containing the above period so that the increased negative ions in the plasma can be implanted into the work surface S. This is owing to the fact that the negative ions are accelerated toward the electrode 2 by the potential difference between the electrode 2 and the plasma P during the period of the application of the positive voltage to the electrode 2. The work S may partially have an insulated portion (a portion made of an electrically insulating material or a portion in a floated potential) at its surface. In this case, the negative ions are also implanted into a portion of the insulated portion. However, charges of the implanted negative ions and charges of the emitted secondary electrons cancel each other so that accumulation of the charges at the work surface S can be suppressed to a practically allowable extent. Thereby, it is possible to suppress the irregular surface treatment of the work S which may be caused by accumulation of the charges as well as damages of the work S which may be caused by discharging at the vicinity of the work surface S.

The positive pulse voltage applied to the electrode 2 is in a range from 50 V to 300 kV. If it were lower than 50 V, the ions implanted into the work would have an excessively low energy so that the ion implantation would not achieve an intended effect. If it were higher than 300 kV, the discharge current would excessively increase so that the thermal damage applied to the work would impractically increase. The magnitude of the positive pulse voltage is appropriately determined within the above range in accordance with the specific treatment to be effected. When the ions are to be implanted into a portion at a small depth from the surface of the work, the positive pulse voltage is set in a range from 50 volts to several kilovolts. If the ions are to be implanted into a comparatively deep portion, the voltage is set in a range from several kilovolts to 300 kilovolts.

As another example for implementing the method of the invention by the apparatus shown in FIG. 2, such a manner may be employed that the plasma is formed from the treatment gas by supplying the pulse-modulated high-frequency power to the electrode 7 similarly to the foregoing embodiment, and the positive pulse voltage is applied to the electrode 2 at the predetermined timing. Also, the negative pulse voltage is applied to the electrode 2 from the DC power source 23 through the switch 23S (see FIG. 2) during an off-period of application of the positive pulse voltage to the electrode 2.

The switch 23S is controlled by the control unit CONT. The DC power source 23 for applying the negative pulse voltage may commonly use a portion of the DC power source 22 for applying the positive pulse voltage.

The period for applying the negative pulse voltage to the electrode 2 may be the same as a portion or the whole of the off-period of application of the positive pulse voltage to the electrode 2. For example, as shown at (C) in FIG. 3, the negative pulse voltage is applied from the DC power source 23 during the same period as the on-period of supply of the pulse-modulated high-frequency power to the electrode 7. This improves the speed of treating the work S. Even when the negative pulse voltage is applied in the above manner, accumulation of the positive charges at the surface of the insulated portion can be suppressed to an allowable extent by applying the positive pulse voltage during a period other than the above.

Figure 4:
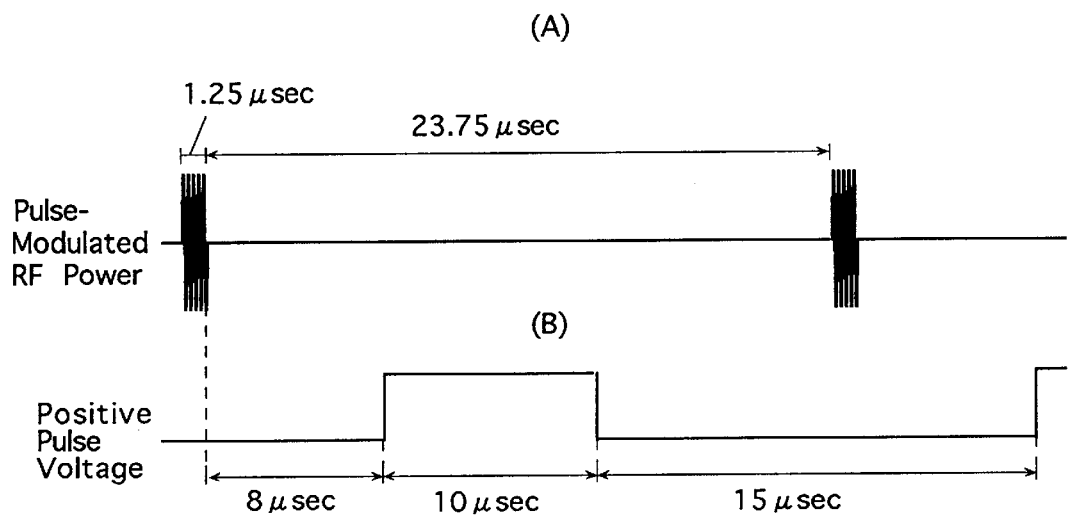
FIG. 4 shows at (A) a specific example of timing of supply of the pulse-modulated high-frequency power to the electrode 7 during work surface treatment by the apparatus in FIG. 2, and shows at (B) a specific example of the timing of supply of the positive pulse voltage to the electrode 2.

As exemplified in FIG. 4, the application of the positive pulse voltage to the electrode 2 from the power source 22 may be performed during a period containing a period within the off-period of supply of the high-frequency power to the electrode 7 and particularly during a period in which the quantity of negative ions is large (preferably, a period starting before and ending after the peak of the quantity of the negative ions).

As an example of the work surface treatment apparatus of the preferred embodiment of the invention, description has been given on the treatment apparatus of the capacity-coupling type in which the electrode 7 electrically insulated from the work support electrode 2 supplied with the modulated high-frequency power is arranged in the vacuum container 1 (see FIG. 2). However, such a treatment apparatus of an induction-coupling type may be employed that an electrode electrically insulated from the work support electrode supplied with the modulated high-frequency power is wound around the vacuum container.

According to the invention, when a high-frequency power is supplied, a magnetic field may be formed, thereby a helicon wave plasma can be formed.

According to the invention, when the treatment gas is a deposition gas, a film can be deposited on the work. Also, etching can be performed with an etching gas, and modification of a surface quality can be performed with a surface quality modification gas.

A specific example will now be described below. In this example, the apparatus in FIG. 2 was used. The pulse-modulated high-frequency power and the positive pulse voltage were supplied to the electrodes 7 and 2 in accordance with patterns shown at (A) and (B) in FIG. 4, respectively. According to the pattern of supply of the pulse-modulated high-frequency power shown at (A) in FIG. 4, the on-time was 1.25 μsec, the off-time was 23.75 μsec and the duty ratio was 5%. As shown at (B) in FIG. 4, the positive pulse voltage rose after 8 μsec from cut-off of the pulse-modulated high-frequency power, and fell down elapsing of 10 μsec after the rising. A work was made of stainless steel but had a portion electrically insulated by plastics. By the treatment, a titanium nitride film was deposited on a surface of the portion made of the stainless steel of the work.

Specifications of the Apparatus
    Size of high-frequency electrode 7: 270 mm in diameter
    Size of work support electrode 2: 300 mm in diameter
    Distance between electrodes: 30 mm
Conditions for Deposition
    Work S: a work made of stainless steel and having a portion made of plastics (The portion of stainless steel had a length of 150 mm, a width of 16 mm and a thickness of 10 mm.)
    Pulse-modulated high-frequency power:
        Basic high-frequency power:
            frequency: 13.56 MHz
            200 W
        Pulse modulation frequency: 40 kHz
        Duty ratio: 5%
    Positive pulse voltage: 5 kV
        frequency: 40 kHz
        on-time: 10 μsec
        off-time: 15 μsec
    Deposition gas:
        $TiCl_4$ 16 sccm (tank temperature: 50° C.)
        $N_2$ 10 sccm
    Deposition pressure: 0.1 Torr
    Deposition time: 5 minutes Any discharge scratch or damage was not found at the surface of the titanium nitride film obtained in this above example.

A pulling jig or member having a columnar form of 8 mm in diameter was adhered by adhesive onto the surface of the titanium nitride film deposited in this above example, and a force required for separating the pulling jig from the surface was measured for evaluating the film adhesion strength. As a result, it was found that the film adhesion strength was 20 times or more larger than that of a titanium nitride film formed by a conventional plasma CVD method. It can be consider that the high film adhesion strength was achieved owing to implantation of the negative ions in the plasma into the work S in addition to the effect by the conventional plasma CVD.

Figure 5:
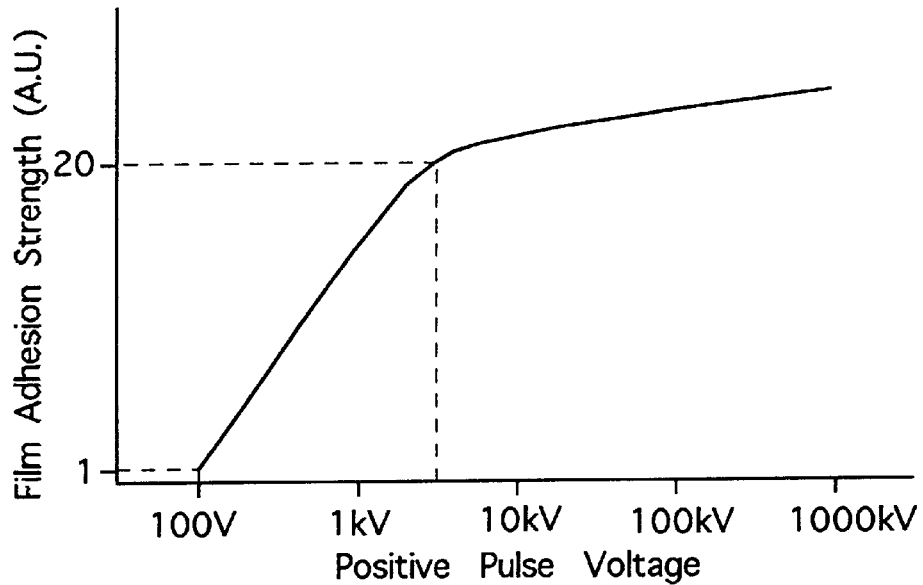
FIG. 5 shows an example of a relationship between the positive pulse voltage and the adhesion strength of a film formed by the method of the invention.
Figure 6:
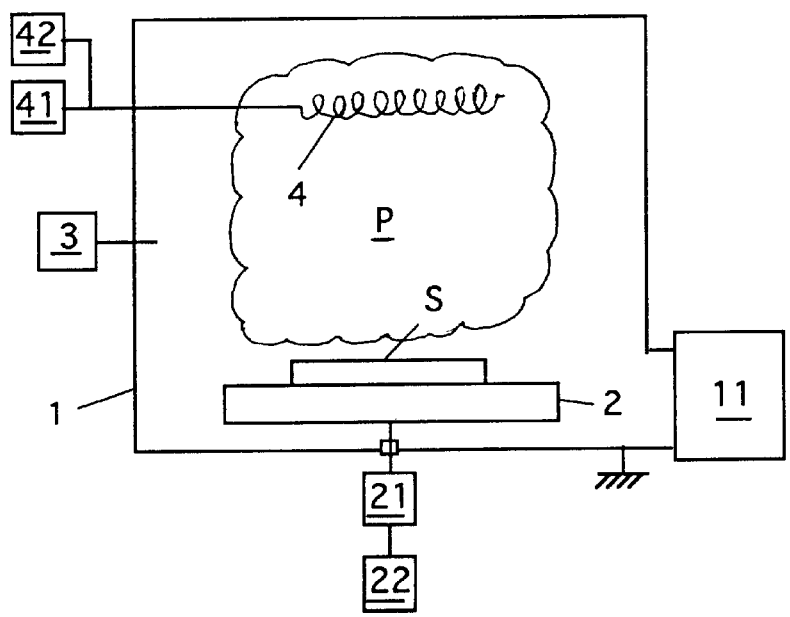
FIG. 6 shows a schematic structure of an example of a work surface treatment apparatus in the prior art.

FIG. 5 shows relative values of the film adhesion strength with various magnitudes of the positive pulse voltage applied to the electrode 2 from 100 V to 1000 kV. It can be seen from FIG. 5 that the film adhesion strength increases with the positive pulse voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A work surface treatment method comprising the steps of supporting a work by a work support electrode arranged in a vacuum container; supplying a treatment gas corresponding to intended treatment of the work into said container; forming plasma from said gas by applying in a vacuum an amplitude-modulated high-frequency power to an electrode electrically insulated from said work support electrode, said amplitude-modulated high-frequency power being prepared by effecting amplitude modulation on a basic high-frequency power having a predetermined frequency in a range from 10 MHz to 200 MHz with a modulation frequency in a range from $\frac{1}{1000}$ to $\frac{1}{10}$ of said predetermined frequency; and applying a positive pulse voltage to said work support electrode to effect the treatment on the surface of said work supported by said work support electrode.

2. The work surface treatment method according to claim 1, wherein said amplitude modulation is pulse modulation.

3. The work surface treatment method according to claim 2, wherein the timing of each rising of said positive pulse voltage is determined between an intermediate time in the on-period of said pulse-modulated high-frequency power and a time in the subsequent off-period, and the timing of each falling of the positive pulse voltage is determined between a time in the off-period of said pulse-modulated high-frequency power and an intermediate time in the subsequent on-period.

4. The work surface treatment method according to claim 1, wherein said positive pulse voltage is in a range from 50 V to 300 kV.

5. The work surface treatment method according to claim 1, wherein a negative pulse voltage is applied to the work support electrode during the off-period of application of said positive pulse voltage.

6. The work surface treatment method according to claim 1, wherein said work has a surface portion made of an electrically insulating material or carrying a floated potential.

7. A work surface treatment method comprising the steps of supporting a work by a work support electrode arranged in a vacuum container; supplying a treatment gas corresponding to intended treatment of the work into said container; forming plasma from said gas by applying in a vacuum an pulse-modulated high-frequency power to an electrode electrically insulated from said work support electrode, said pulse-modulated high-frequency power being prepared by effecting pulse modulation on a basic high-frequency power having a predetermined frequency in a range from 10 MHz to 200 MHz with a modulation frequency in a range from $\frac{1}{1000}$ to $\frac{1}{10}$ of said predetermined frequency; and applying a positive pulse voltage in a range from 50 V to 300 kV to said work support electrode to effect the treatment on the surface of said work supported by said work support electrode, wherein the timing of rising of said positive pulse voltage is determined between an intermediate time in the on-period of said pulse-modulated high-frequency power and a time in the subsequent off-period, and the timing of falling of the positive pulse voltage is determined between a time in the off-period of said pulse-modulated high-frequency power and an intermediate time in the subsequent on-period.

8. The work surface treatment method according to claim 7, wherein a negative pulse voltage is applied to the work support electrode during the off-period of application of said positive pulse voltage.

9. The work surface treatment method according to claim 7, wherein said work has a surface portion made of an electrically insulating material or carrying a floated potential.

10. The work surface treatment method according to claim 8, wherein said work has a surface portion made of an electrically insulating material or carrying a floated potential.

* * * * *